(12) United States Patent
Tan et al.

(10) Patent No.: US 8,338,292 B2
(45) Date of Patent: Dec. 25, 2012

(54) BODY CONTACTS FOR FET IN SOI SRAM ARRAY

(75) Inventors: Yue Tan, Hopewell Junction, NY (US); Zhibin Ren, Hopewell Junction, NY (US); Richard A. Wachnik, Hopewell Junction, NY (US); Haining S. Yang, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 402 days.

(21) Appl. No.: 12/707,191

(22) Filed: Feb. 17, 2010

(65) Prior Publication Data

US 2010/0207213 A1 Aug. 19, 2010

Related U.S. Application Data

(60) Provisional application No. 61/153,467, filed on Feb. 18, 2009.

(51) Int. Cl.
*H01L 21/44* (2006.01)
(52) U.S. Cl. ........ 438/664; 438/586; 438/592; 438/649; 438/651; 438/655; 257/E21.165
(58) Field of Classification Search .................. None
See application file for complete search history.

(56) References Cited

U.S. PATENT DOCUMENTS

| | | | |
|---|---|---|---|
| 5,338,698 A * | 8/1994 | Subbanna | 438/237 |
| 6,410,369 B1 | 6/2002 | Flaker et al. | |
| 6,624,459 B1 | 9/2003 | Dachtera et al. | |
| 6,635,518 B2 | 10/2003 | Aipperspach et al. | |
| 6,646,305 B2 | 11/2003 | Assaderaghi et al. | |
| 6,815,282 B2 | 11/2004 | Dachtera et al. | |

OTHER PUBLICATIONS

"Field Effect Transistors in Theory and Practice"—Motorola Semiconductor Application Note—Application Note AN211A—Motorola Inc., 1993.

* cited by examiner

*Primary Examiner* — Kyoung Lee
(74) *Attorney, Agent, or Firm* — Joseph P. Abate; Howard M. Cohn

(57) ABSTRACT

Contact with a floating body of an FET in SOI may be formed in a portion of one of the two diffusions of the FET, wherein the portion of the diffusion (such as N–, for an NFET) which is "sacrificed" for making the contact is a portion of the diffusion which is not immediately adjacent (or under) the gate. This works well with linked body FETs, wherein the diffusion does not extend all the way to BOX, hence the linked body (such as P–) extends under the diffusion where the contact is being made. An example showing making contact for ground to two NFETs (PG and PD) of a 6T SRAM cell is shown.

11 Claims, 11 Drawing Sheets

BODY CONTACTS FOR FET IN SOI SRAM ARRAY

This non-provisional application claims the benefit of the provisional application filed with the United States Patent and Trademark Office as Ser. No. 61/153,467 entitled "BODY CONTACTS FOR FET IN SOI SRAM ARRAY" filed Feb. 18, 2009.

FIELD OF THE INVENTION

The invention relates to semiconductor device fabrication and, more particularly, to making body contacts to field effect transistors (FETs), such as FETs formed in silicon on insulator (SOI) substrates, such as FETs in a static random access memory (SRAM) cell.

BACKGROUND OF THE INVENTION

The transistor is a solid state semiconductor device which can be used for amplification, switching, voltage stabilization, signal modulation and many other functions. Generally, a transistor has three terminals, and a voltage applied to a specific one of the terminals controls current flowing between the other two terminals. One type of transistor is known as the field effect transistor (FET).

The terminals of a field effect transistor (FET) are commonly named source, gate and drain. In the FET, a small amount of voltage is applied to the gate (G) in order to control current flowing between the source (S) and drain (D). In FETs, the main current appears in a narrow conducting channel formed near (usually primarily under) the gate. This channel connects electrons from the source terminal to the drain terminal. The channel current (or conductivity) can be altered by varying the voltage applied to the gate terminal or by widening or narrowing the conducting channel and thereby controlling the current flowing between the source and the drain.

FIG. 1A illustrates a FET comprising a p-type substrate (in this example, a p-well in a substrate), and two spaced-apart n-type diffusion areas—one of which may serve as the "source", the other of which may serve as the "drain" of the transistor. The space between the two diffusion areas is called the "channel." The channel is where current flows, between the source (S) and the drain (D). In this example, the channel is p-type (doped with an electron acceptor material such as boron or indium, and the diffusions are n-type (doped with an electron donor material such as phosphorous or arsenic). A schematic symbol for an n-channel MOSFET (which is an NFET) appears to the left of FIG. 1A.

A thin dielectric layer ("dielectric") is disposed on the substrate above the channel, and a "gate" conductor (G) is disposed over the dielectric layer, thus also atop the channel. (The dielectric under the gate is also commonly referred to as "gate oxide" or "gate dielectric".) The gate conductor ("gate") is commonly doped polysilicon (poly). The "gate stack" is thus poly over oxide over silicon.

Electrical connections (not shown) may be made to the source (S), the drain (D), and the gate (G). The substrate may be grounded or biased at a desired voltage depending on applications. The source (S) and drain (D) are typically two diffusions formed the same as (mirror images of) one another, and whether they are functioning as source or drain depends on how they are connected in a circuit. In any case, one will serve as the source, the other as drain.

Generally, for operating an NFET, the drain (D) is biased with a positive voltage and the source (S) is at ground potential, and when there is no voltage applied to the gate (G), there is no electrical conduction (connection) between the source (S) and the drain (D). As positive voltage is applied to the NFET gate, there is a "field effect" in the channel between the source and the drain, and current can flow between the source and the drain. This current flowing in the channel (between the source and the drain) can be controlled by the voltage applied to the gate. In this manner, a small signal (gate voltage) can control a relatively large signal (the current flowing between the source and the drain).

Originally, the gate conductor ("gate") was formed with a metal material, which gave rise to the term "MOS", which stands for metal-oxide-silicon (or metal-oxide-semiconductor). Nowadays, polysilicon ("poly"), doped to be conductive, is the more common choice of material for the gate conductor.

The FET shown in FIG. 1A is exemplary of a MOSFET. With the specified "n" and "p" types shown above, an "n-channel MOSFET", or "NFET" can be formed. With opposite polarities (swapping "p" for "n" in the diffusions, and "n" for "p" in the substrate or well), a p-channel MOSFET, of "PFET" can be formed. Transistors of opposite (complementary) polarity are often paired with one another to make circuits, giving rise to the term "CMOS", which stands for complementary metal oxide silicon (or semiconductor).

While particular n- and p-type dopants may be described hereinbelow, according to NMOS technology, it is to be appreciated that one or more aspects of the present invention may be equally applicable to forming a PMOS (generally, simply by reversing the n- and p-type dopants).

An integrated circuit (IC) device may comprise many millions of FETs (MOSFETs) on a single semiconductor "chip" (or "die"), measuring only a few centimeters on each side. Several chips may be formed simultaneously, on a single "wafer", using conventional semiconductor fabrication processes including deposition, doping, photolithography, and etching. The various devices (such as FETs) within the chips may be interconnected by layers of metal lines in a dielectric material (typically oxide), with vias extending between different levels of the metal lines as well as to portions of the devices.

FIG. 1A also shows shallow trench isolation (STI), surrounding the FET (NFET). To form STI, generally, a shallow trench is etched into the substrate and filled with an insulating material such as oxide, to isolate one region of the substrate from an adjacent region of the substrate. One or more transistors (such as FETs) of a given polarity (NFET or PFET) may be disposed within a given area isolated by STI. As its name implies, the "shallow trench" is generally not as deep as a "deep trench" (for a given trench width). For example, a deep trench, may have a depth of approximately 2000-5000 nm (2-5 microns) and a width of approximately 50-175 nm. Therefore, a deep trench is usually much deeper than it is wide, having an aspect ratio (depth-to-width) of approximately 40:1. Shallow trenches, such as are used for STI, may have a depth of approximately 20-300 nm and a width of at least 10 nm (they can generally be as wide as desired), resulting in an aspect ratio (depth-to-width) of approximately at most 3:1, more typically 2:1 or lower, such as 1:1.

FIG. 1A also shows p+ halo (or pocket) implants and n+ S/D extension implants in the substrate, under the gate. The halo implant may be performed with the wafer tilted so that the implanted ions penetrate underneath the gate beyond the extent of the source/drain extension implant. The halo implant may be of the same polarity as the channel, and opposite polarity from the source/drain (S/D) implants. The S/D extension implants may be located above (closer to the substrate surface) than halo implants, and may extend from an inner edge of the respective source and drain diffusions. The extension doping areas may overlap with (under the) gate conductor. A S/D extension may be of the same polarity as the source/drain (S/D) implants, and opposite polarity from the channel.

FIG. 1A also shows sidewall spacers ("spacer") formed on sides of the gate stack ("gate"). Typically formed of a dielectric material, such as oxide or nitride, sidewall spacers disposed on opposite sides of a gate electrode structure may cause subsequent implants to occur further away from the gate than otherwise (without the spacers in place), thereby controlling (increasing) the length of a channel under the gate electrode structure.

See also, Field Effect Transistors in Theory and Practice, Semiconductor Application Note, AN211A, copr. Motorola, Inc., 1993, incorporated by reference herein.

SOI Substrates

Silicon on insulator technology (SOI) refers to the use of a layered silicon-insulator-silicon substrate in place of conventional silicon substrates in semiconductor manufacturing, especially microelectronics. SOI-based devices differ from conventional silicon-built devices in that the silicon junction is above an electrical insulator, typically silicon dioxide or (less commonly) sapphire. The choice of insulator depends largely on intended application, with sapphire being used for radiation-sensitive applications and silicon oxide preferred for improved performance and diminished short channel effects in microelectronics devices. The precise thickness of the insulating layer and topmost silicon layer also vary widely with the intended application.

SiO2-based SOI substrates (or wafers) can be produced by several methods:

SIMOX—Separation by IMplantation of OXygen—uses an oxygen ion beam implantation process followed by high temperature annealing to create a buried SiO2 layer.

Wafer Bonding—the insulating layer is formed by directly bonding oxidized silicon with a second substrate. The majority of the second substrate is subsequently removed, the remnants forming the topmost Si layer.

Seed Methods—wherein the topmost Si layer is grown directly on the insulator. Seed methods require some sort of template for homoepitaxy, which may be achieved by chemical treatment of the insulator, an appropriately oriented crystalline insulator, or vias through the insulator from the underlying substrate.

A typical SOI-type substrate may comprise a layer of silicon ("SOI") atop a buried oxide (BOX, insulator) layer, which is atop an underlying substrate which may be a silicon substrate. The BOX layer may have a thickness of 500-2500 Å (50-250 nm). The silicon (SOI) layer may have a thickness of 50-200 Å (5-20 nm).

Pad films comprising a layer of oxide and a layer of nitride may be disposed atop the SOI layer 206. The pad oxide layer may have a thickness of 10-20 Å (1-2 nm), and the pad nitride layer may have a thickness of 400-1500 Å (40-150 nm).

Body Effects

Bulk silicon field effect transistors (FETs) have commonly been formed on the surface of a silicon chip or wafer. In what is typically referred to as CMOS technology, the silicon wafer or substrate may be of one conduction type, e.g., P-type, and areas or wells of a second conduction type, e.g., N-type, are formed in the P-type wafer. N-type FETs (NFETs) are formed on the surface of the P-type wafer and P-type FETs (PFETs) are formed on the surface of the N-wells.

More recently, silicon on insulator (SOI) technology has become a source of performance improvement for transistors. SOI transistors may be formed on the surface of a silicon layer isolated from a silicon substrate by a buried oxide (BOX) layer. In a typically complex series of mask steps, shallow trenches filled with oxide isolate SOI islands of the surface silicon layer on which FETs are formed. Circuit wiring in layers above the FETs connects the FETs into circuits.

Ideally, each FET is isolated from unintended parasitic effects from every other FET. Back biases may be applied to SOI FETs through a contact to the underlying layer (or body contact) that may require as much area as the FET itself and may make circuit wiring more difficult. Consequently, especially for dense SOI memory arrays, body contacts are omitted completely for maximum device density. Unfortunately, as body contacts are eliminated or at the very least shared by more and more devices, individual devices become much more susceptible to localized device phenomena known as body effects. Localized body effect variations cause device non-uniformity.

Body effects, also known as history effects, occur in completely or partially isolated devices, especially in analog logic circuit FETs, memory devices (FETs) or in logic where device body contacts may be infrequent or eliminated. As a particular device switches off, charge (i.e., majority carriers) remains in the device body beneath the channel. Device leakage and parasitic bipolar effects may add to the charge. Charge builds at isolated locations as the chip operates because the charge from fast switching devices is injected into locally isolated body pockets faster than it dissipates. Eventually, the injected charge reaches some steady state value that acts as a substrate bias for the device. This steady state change depends upon each particular device's switching history and is typically known as the history effect for the particular device. So, body effects may cause two devices that are identical by design may exhibit some difference, difference that may be time varying from changing circuit conditions. Normally, slight variations in device characteristics such as device thresholds, are negligible, neglectable and not given much consideration for typical logic circuits such as decoders, clock buffers, input or output drivers and array output drivers.

These localized body effects and other sporadically occurring parasitic bipolar effects, i.e., at source/drain diffusion junctions, are serious design problems for densely packed SOI circuits such as for example, memory arrays, e.g., a Static RAM (SRAM) macro. A SRAM cell is, essentially, an identical pair of cross coupled transistors loaded with high resistance load resistors and a pair of pass transistors between internal storage nodes and a pair of bit lines. The state of the cross coupled pair determines the state of data stored in the cell. Each SRAM cell is read by coupling the cross coupled transistors through the access transistors to the bit line pair and measuring the resulting voltage difference on the bit line pair. The signal on the bit line pair increases with time toward a final state wherein each one of the pair may be, ultimately, a full up level and a full down level. However, to improve performance, the voltage difference is sensed well before the difference reaches its ultimate value.

Floating Body Effect

NFET and PFET devices fabricated in SOI technology offer advantages over bulk devices. The advantages include reduced junction capacitance, reduced junction leakage current, and for fully depleted devices, reduced short channel effect, increased transconductance and reduced threshold voltage ($V_T$) sensitivity. However, SOI FETs have a "floating body." The body or channel region of the FET is formed in an insulated pocket of silicon and is therefore not electrically connected to a fixed potential. One effect of the "floating body" is to lower the $V_T$ of the device when the body "floats up". This is a particular problem in a SRAM cell as lowering the $V_T$ of the devices can cause the relative strengths of devices to change such that the cell flips when the state of the latch is read.

SOI generally provides lower junction capacitance and leakage. However, floating body effects may result in:
history dependent Vt shifts
reduced SRAM stability
parasitic sub-Vt and bipolar condition The floating body effect is the effect of dependence of the body potential of a transistor realized by the silicon on insulator (SOI) technology on the history of its biasing and the carrier recombination processes. The transistor's body forms a capacitor against the insulated substrate. The charge accumulates on this capacitor and may cause adverse effects, for example, opening of parasitic transistors in the structure and causing off-state leakages, resulting in higher current consumption and in case of DRAM in loss of information from the memory cells. It also causes the history effect, the dependence of the threshold voltage of the transistor on its previous states. On analog devices, the floating body effect is known as the kink effect.

One countermeasure to floating body effect involves use of fully depleted devices. The insulator layer in FD devices is significantly thinner than the channel depletion width. The charge and thus also the body potential of the transistors is therefore fixed. However, the short-channel effect is worsened in the FD devices, the body may still charge up if both source and drain are high, and the architecture is unsuitable for some analog devices that require contact with the body.

SRAM

Static random access memory (SRAM) is a type of semiconductor memory where the word "static" indicates that it, unlike "dynamic" RAM (DRAM), does not need to be periodically refreshed, as SRAM uses bistable latching circuitry to store each bit. However, SRAM is still volatile in the (conventional) sense that data is lost when powered down.

Random access means that locations in the memory can be written to or read from in any order, regardless of the memory location that was last accessed.

Each bit in an SRAM is stored on four transistors that form two cross-coupled inverters. This storage cell has two stable states which are used to denote 0 and 1. Two additional access transistors serve to control the access to a storage cell during read and write operations. A typical SRAM uses six MOSFETs to store each memory bit.

A typical static random access memory (SRAM) cell includes an array of individual SRAM cells. Each SRAM cell is capable of storing a binary voltage value therein, which voltage value represents a logical data bit (e.g., "0" or "1"). One existing configuration for an SRAM cell includes a pair of cross-coupled devices such as inverters. With CMOS (complementary metal oxide semiconductor) technology, the inverters further include a pull-up PFET (p-channel) transistor connected to a complementary pull-down NFET (n-channel) transistor. The inverters, connected in a cross-coupled configuration, act as a latch which stores the data bit therein so long as power is supplied to the memory array. In a conventional six-transistor cell, a pair of access transistors or pass gates (when activated by a word line) selectively couple the inverters to a pair of complementary bit lines.

Typically, memory cells are arranged in an array comprising many rows and columns, between wordlines extending horizontally (as usually depicted) across the array and bitlines extending vertically (as usually depicted) up and down the array. A memory array typically comprises many millions ("mega"), including billions ("giga") of memory cells.

FIG. 1B illustrates a single conventional six-transistor ("6T") SRAM memory cell connected to two adjacent bit-lines (BL's), and one wordline (WL). The memory cell may also be connected to a voltage source (Vdd) and ground (gnd).

The SRAM cell structure includes a six-transistor memory cell (in dashed lines) which is capable of storing a binary bit of information. Specifically, the memory cell includes a pair of cross-coupled, complementary metal oxide semiconductor (CMOS) inverters. One inverter includes an NFET storage transistor N1 and a PFET load transistor P1. Similarly, a second inverter includes an NFET storage transistor N2 and a PFET load transistor P2.

Transistors P1 and P2 are often referred to as "pull-up" ("PU") transistors because of their coupling to the voltage source Vdd. The transistors N1 and N2 are often referred to as "pull down" ("PD") transistors, and are connected to ground (gnd).

The memory cell further contains NMOS access transistors NL and NR, each referred to as a "passgate" ("PG"), serving as switches, each of which are coupled between the bistable circuit (P1, N1, P2 and N2) and a pair of complementary bit lines BL and BR, respectively. Passgates NL and NR are activated by an appropriate signal generated on a word line WL A junction node "A" (i.e., the drains) of transistors P1 and N1, as well as the gates of transistors P2 and N2, are coupled through passgate NL to bit line BL. A junction node "B" (i.e., the drains) of transistors P2 and N2, as well as the gates of transistors P1 and N1 are coupled through access transistor NR to complementary bit line BR.

In the above described SRAM cell structure, data is stored as voltage levels within the two sides of the bistable circuit (P1, N1, P2 and N2) in opposite voltage configurations; that is, node A is high and node B is low in one state, and node A is low and the B is high in the other state, thereby resulting in two stable states. Node B is thus the logical complement of node A.

Related Patents

U.S. Pat. No. 6,815,282, incorporated by reference herein, discloses silicon on insulator (SOI) field effect transistors (FET) with a shared body contact, a SRAM cell and array including the SOI FETs and the method of forming the SOI FETs. The SRAM cell has a hybrid SOI/bulk structure wherein the source/drain diffusions do not penetrate to the underlying insulator layer, resulting in a FET in the surface of an SOI layer with a body or substrate contact formed at a shared contact. FETs are formed on SOI silicon islands located on a BOX layer and isolated by shallow trench isolation (STI). NFET islands in the SRAM cells include a body contact to a P-type diffusion in the NFET island. Each NFET in the SRAM cells include at least one shallow source/drain diffusion that is shallower than the island thickness. A path remains under the shallow diffusions between NFET channels and the body contact. The P-type body contact diffusion is a deep diffusion, the full thickness of the island. Bit line diffusions shared by SRAM cells on adjacent wordlines may be deep diffusions.

U.S. Pat. No. 6,646,305, incorporated by reference herein, discloses grounded body SOI SRAM cell. A semiconductor memory device comprising: an SOI substrate having a thin silicon layer on top of a buried insulator; and an SRAM comprising four NFETs and two PFETs located in the thin silicon layer, each the NFET and PFET having a body region between a source region and a drain region, wherein the bodies of two of the NFETs are electrically connected to ground. Additionally, the bodies of the two PFETs are electrically connected to $V_{DD}$ as noted therein.

U.S. Pat. No. 6,624,459, incorporated by reference herein, discloses silicon on insulator field effect transistors having shared body contact. Silicon on insulator (SOI) field effect transistors (FET) with a shared body contact, a SRAM cell and array including the SOI FETs and the method of forming the SOI FETs. The SRAM cell has a hybrid SOI/bulk structure wherein the source/drain diffusions do not penetrate to the underlying insulator layer, resulting in a FET in the surface of an SOI layer with a body or substrate contact formed at a shared contact. FETs are formed on SOI silicon islands located on a BOX layer and isolated by shallow trench isolation (STI). NFET islands in the SRAM cells include a body contact to a P-type diffusion in the NFET island. Each NFET in the SRAM cells include at least one shallow source/drain diffusion that is shallower than the island thickness. A path remains under the shallow diffusions between NFET channels and the body contact. The P-type body contact diffusion is a deep diffusion, the full thickness of the island. Bit line diffusions shared by SRAM cells on adjacent wordlines may be deep diffusions.

U.S. Pat. No. 6,410,369, incorporated by reference herein, discloses SOI-body selective link method and apparatus. A silicon-on-insulator (SOI) structure and method of making the same includes an SOI wafer having a silicon layer of an original thickness dimension formed upon an isolation oxidation layer. At least two p-type bodies of at least two SOI field effect transistors (PFETs) are formed in the silicon layer. At least two n-type bodies of at least two SOI field effect transistors (NFETs) are also formed in the silicon layer. Lastly, an SOI body link is formed in the silicon layer of the SOI wafer adjacent the isolation oxidation layer for selectively connecting desired bodies of either the p-type SOI FETs or the n-type SOI FETs and for allowing the connected bodies to float.

U.S. Pat. No. 6,635,518, incorporated by reference herein, discloses SOI FET and method for creating FET body connections with high-quality matching characteristics and no area penalty for partially depleted SOI technologies. Methods and apparatus are provided for creating field effect transistor (FET) body connections with high-quality matching characteristics and no area penalty for partially depleted silicon-on-insulator (SOI) circuits. The FET body connections are created for partially depleted silicon-on-insulator (SOI) technologies by forming adjacent FET devices inside a shallow trench shape. The adjacent FET devices share a common diffusion area, such as source or drain. Selectively spacing apart adjacent gate lines form an underpath connecting bodies of the adjacent FET devices. The underpath is defined by forming an undepleted region on top of a buried oxide layer. The adjacent polysilicon gate lines are selectively spaced apart to define a depth of depletion in a shared diffusion region for creating the underpath. Also, adjacent FET devices with connecting bodies can be built by adding an ion implant masking step to the fabrication process. This masking step changes the depletion depth under the shared diffusion area. As a result an underpath body connection is formed. Such methods of building adjacent FET devices with an underpath connecting the two device bodies can be used in combination.

SUMMARY OF THE INVENTION

It is a general object of the invention to provide an improved technique for implementing body contacts in SOI FETs.

According to the invention, generally, in a situation where a portion of a body (such as P−) of an FET (such as an NFET) extends under at least one of the S/D diffusions (such as N+), contact with the floating body of the FET may be made by etching an opening through the diffusion. The opening through the diffusion is made away from the gate, leaving the diffusion adjacent the channel intact. Subsequent siliciding will form a contact. The body can then be biased (at a selected voltage, or ground) to the same voltage as the diffusion through which the contact is made.

In a SOI substrate, the FET may be one of a pair of adjacent FETs, such as a pull down NFET and related pass gate NFET of a 6T SRAM cell. In a pair of adjacent FETs, the bodies of the FETs may be linked. In SOI, linked bodies may result from the S/D diffusions being controlled so as to extend only partially through the silicon layer, not reaching the BOX. Since the diffusions (such as N+) do not extend all the way to BOX, the linked body (such as P−) extends under all of the diffusions. To bias such a linked body, contact need only be made through one of the diffusions of one of the transistors, such as the outer S/D diffusion of a pull down FET of an SRAM, which is biased to ground.

According to an embodiment of the invention, a method of making contact with a body of an FET comprises: etching an opening through a S/D diffusion of the FET, thereby exposing a portion of the body which is extending under the diffusion; and siliciding to form a contact with the body. The opening may be spaced approximately 20-25 nm away from a gate stack of the FET. The portion of the body extending under the diffusion may have a thickness of approximately 15 nm. The contact may be connected to ground. The FET may be a pull down NFET of an SRAM cell.

According to an embodiment of the invention, a method of forming FETs with floating bodies on SOI substrates, and making contact to selected ones of the floating bodies, comprises: forming S/D diffusions extending only partway through a silicon layer atop a buried oxide (BOX) layer, resulting in a portion of the body of the transistor extending under the S/D diffusions; etching an opening through at least one of the S/D diffusions of at least one of the FETs, thereby exposing a portion of the floating body which is extending under the diffusion area; and making contact with the body through the opening. The opening may be spaced approximately 20-25 nm away from a gate stack of the FET. The silicon layer may have a thickness of approximately 75 nm; and the S/D diffusions may extend approximately 60 nm into the silicon layer. The portion of the body extending under the S/D diffusions may have a thickness of approximately 15 nm. Contact with the body may be made by siliciding. The FET may be a pull down (PD) FET of an SRAM. The contact may be connected to ground.

According to an embodiment of the invention, a 6T SRAM cell having a pull down NFET, wherein the pull down NFET has a S/D diffusion which is connected to ground (gnd), comprises; an opening extending through the S/D diffusion of the pull down NFET, exposing a portion of a body of the pull down NFET which is extending under the S/D diffusion; and a contact with the body, formed in the opening. The contact may comprise silicide. The opening may be spaced approximately 20-25 nm away from a gate stack of the pull down FET. The portion of the body extending under the S/D diffusion may have a thickness of approximately 15 nm. The SRAM cell may be formed on an SOI substrate. The S/D diffusion may extend only partway through a silicon layer atop a buried oxide (BOX) layer, resulting in the portion of the body of the transistor extending under the S/D diffusion. The silicon layer may have a thickness of approximately 75 nm;

and the S/D diffusion may extend approximately 60 nm into the silicon layer. The contact may be connected to ground.

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting.

FIG. 8B is an "exploded" cross-sectional view of the SOI substrate of FIG. 8A, according to the invention.

FIG. 9B is an "exploded" cross-sectional view of the SOI substrate of FIG. 9A, according to the invention.

FIG. 10B is an "exploded" cross-sectional view of the SOI substrate of FIG. 10A, according to the invention.

DETAILED DESCRIPTION OF THE INVENTION

In the description that follows, numerous details are set forth in order to provide a thorough understanding of the present invention. It will be appreciated by those skilled in the art that variations of these specific details are possible while still achieving the results of the present invention. Well-known processing steps and materials are generally not described in detail in order to avoid unnecessarily obfuscating the description of the present invention.

Bulk silicon is currently in wider use than silicon on insulator (SOI). SOI uses a thin film, capacitance is low, and there is no path from source/drain (S/D) to the body so the leakage is low. However, floating body effects may impair device performance. Making contact with the body of SOI FETs may reduce floating body effects, but is difficult to implement in SRAM array without sacrificing cell area. Linking body contacts provide significant reduction of variation across memory cells across an array. Body contacts using large area contact or separate implants are known but do not fit with the confines of memory cell groundrules. Linking body contacts to the source without extra implants and using only a block mask and etch steps with subsequent silicide formation may have significant advantages over the alternatives.

Figure 2A:
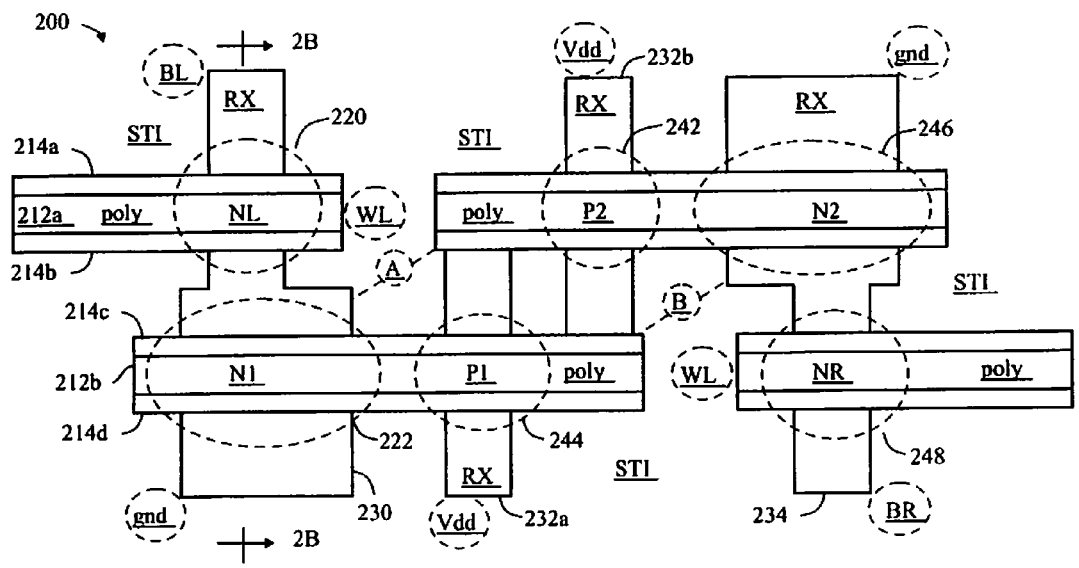
FIG. 2A is a top plan view of an SOI substrate having a 6T SRAM cell, of the prior art.
Figure 2B:
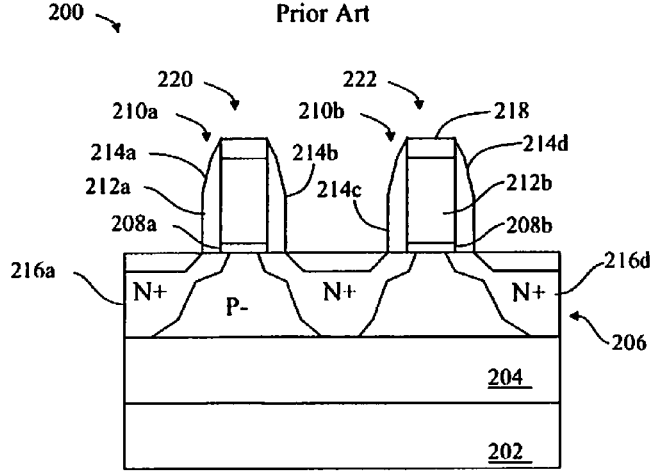
FIG. 2B is a cross-sectional view of the SOI substrate of FIG. 2A.

FIGS. 2A and 2B illustrate a typical SOI substrate 200 of the prior art, with floating body transistors (FETs) formed therein.

As best viewed in FIG. 2B, the SOI substrate 200 may comprise a support substrate 202 having a thickness of a few hundred microns, an insulator (typically oxide) layer 204 having a thickness of approximately 10 μm (10,000 nm), and a thin silicon layer 206 having a thickness of approximately 1000 nm (1 μm). The oxide layer 204 is generally referred to as "buried" oxide (BOX).

Two transistors 220 and 222 may be formed on the substrate 200, as follows. A thin layer of oxide having a thickness of approximately a few microns is disposed on the surface of the silicon layer 206, and is patterned to become gate dielectrics 208a and 208b (collectively referred to as "208") for the two transistors 220 and 222. Polysilicon structures 212a and 212b (collectively referred to as "212") are disposed on the gate dielectrics 208. The polysilicon conductors 212 may have a width of approximately 60 nm, and a thickness of approximately 80 nm. The polysilicon conductors 212 may be spaced approximately 200 nm apart from one another.

Two gate stacks 210a and 210b (collectively referred to as "210") are thus disposed on the silicon layer 206. Each gate stack 210a and 210b comprises a gate oxide 208a and 208b, a polysilicon conductor 212a and 212b, respectively.

Sidewall spacers 214a and 214b may be formed on the gate stack 210a, and sidewall spacers 214c and 214d may be formed on the gate stack 210b.

Source and drain diffusions 216a and 216b may be formed on the left (as viewed) and right (as viewed) sides of the gate stack 210a, in the silicon layer 206, and source and drain diffusions 216c and 216d may be formed on the left (as viewed) and right (as viewed) sides of the gate stack 210b, in the silicon layer 206. The diffusions 216a, 216b, 216c and 216d may collectively be referred to as "216".

The FET 220 comprises the gate stack 210a and diffusions 216a and 216b.

The FET 222 comprises the gate stack 210b, and diffusions 216c and 216d. Silicide 218 may be disposed on the diffusions 216 and on the polysilicon conductors 212.

The S/D diffusions 216b and 216c may be formed as one continuous diffusion. The diffusion 216a may be formed as one continuous diffusion with a diffusion of another transistor (not shown) to the left of the transistor 220, and the diffusion 216d may be formed as one continuous diffusion with a diffusion of another transistor (not shown) to the right of the transistor 222.

An upper portion of the silicon layer between the source and drain diffusions may be referred to as the "channel", and a lower portion of the silicon layer between the source and drain diffusions may be referred to as the "body". The silicon layer may be doped to have P− polarity, and the source/drain (S/D) diffusions may be doped to have n+ polarity.

The transistors 220 and 222 are "floating body" FETs. With bulk silicon, n-typed device bodies are tied to ground, and p-type device bodies are tied to Vdd. With SOI, the device body can be tied (connected) to whatever potential is desired, but contact must be made, since the body sits on a layer of oxide. However, making contact with the device body of an SOI FET carries with it a nontrivial area penalty. In this example, the bodies of the transistors 220 and 222 are P-type. In FIG. 2B is can readily be seen that the P-type bodies are separated from each other, and are therefore isolated from each other.

As best viewed in FIG. 2A, active areas 230, 232a, 232b and 234 may be formed for six transistors 220, 222, 242, 244, 246, 248 transistors of a 6 transistor ("6T") SRAM cell. Active area may be referred to as "RX". The two transistors 220 and 222 on the left may be NFETs, and have been described in detail with respect to FIG. 2B. The two transistors 246 and 248 on the right may also be NFETs, formed similarly to the transistors 220 and 222. The two transistors 242 and 244 in the middle (as viewed) may be PFETs, formed similarly to but with opposite polarity from the NFETs 220, 222, 246, 248. (Notice that the left RX 230 and the right RX each support two NFETs, but that the middle RX for the two PFETs is created in two pieces.) Generally, there is usually shallow trench isolation (STI) surrounding the active (RX) areas.

Figure 1A:
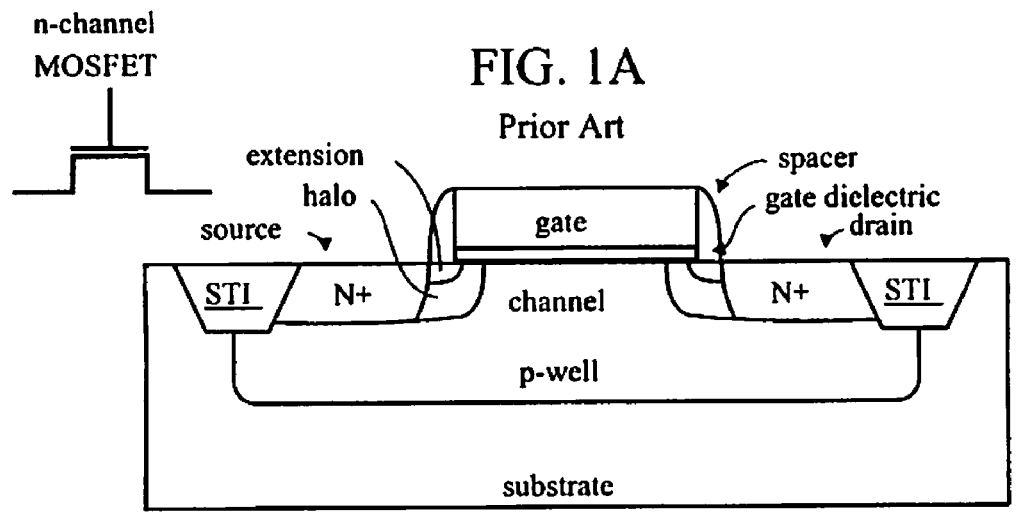
FIG. 1A is a cross-sectional view of a FET, according to the prior art.
Figure 1B:
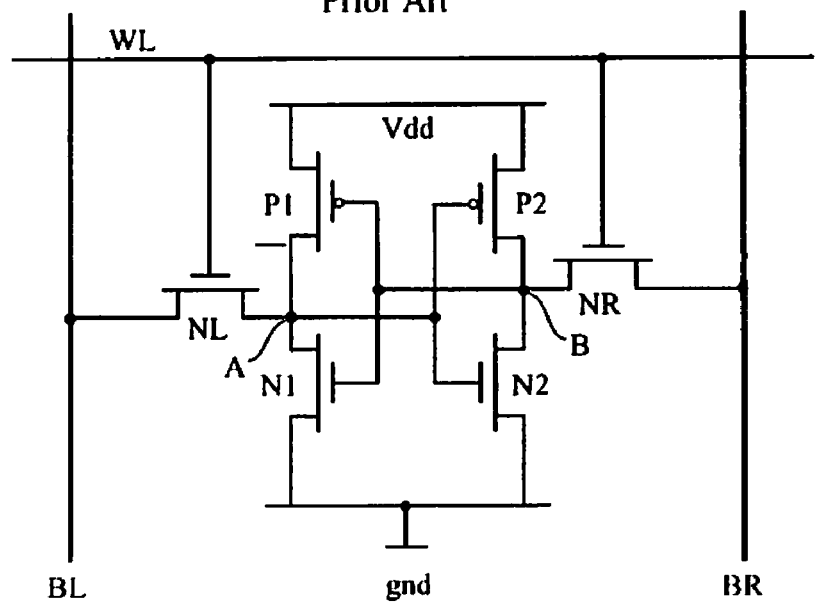
FIG. 1B is a cross-sectional view of a 6T SRAM cell, according to the prior art.

In FIG. 2A, it may be noted that the gates ("poly") NFET 222 and PFET 244 are contiguous (connected) with one another, and this corresponds to transistors N1 and P1 in FIG. 1B. It may also be noted that the gates ("poly") PFET 242 and NFET 246 are contiguous (connected) with one another, and this corresponds to transistors P2 and N2 in FIG. 1B. Generally, the following correlations may be made.

$$NFET220(320,420,520)=NL(PG)$$

$$NFET222(322,422,522)=N1(PD)$$

$$PFET242(342,442,542)=P2(PU)$$

$$PFET244(344,444,544)=P1(PU)$$

$$NFET246(346,446,546)=N2(PD)$$

$$NFET248(348,448,548)=NR(PG)$$

It may also be noted in FIG. 2 that the poly gate of P1 extends to a diffusion of P2, which is also the node "B". And, that the poly gate of P2 extends to a diffusion of P1, which is also the node "A".

Linked Body Devices

As shown in FIG. 2B, generally, in SOI devices, the S/D junctions reach the BOX (204), which separates the bodies of all neighboring devices, which can resulting in the "floating body" or "history" effect.

Figure 3A:
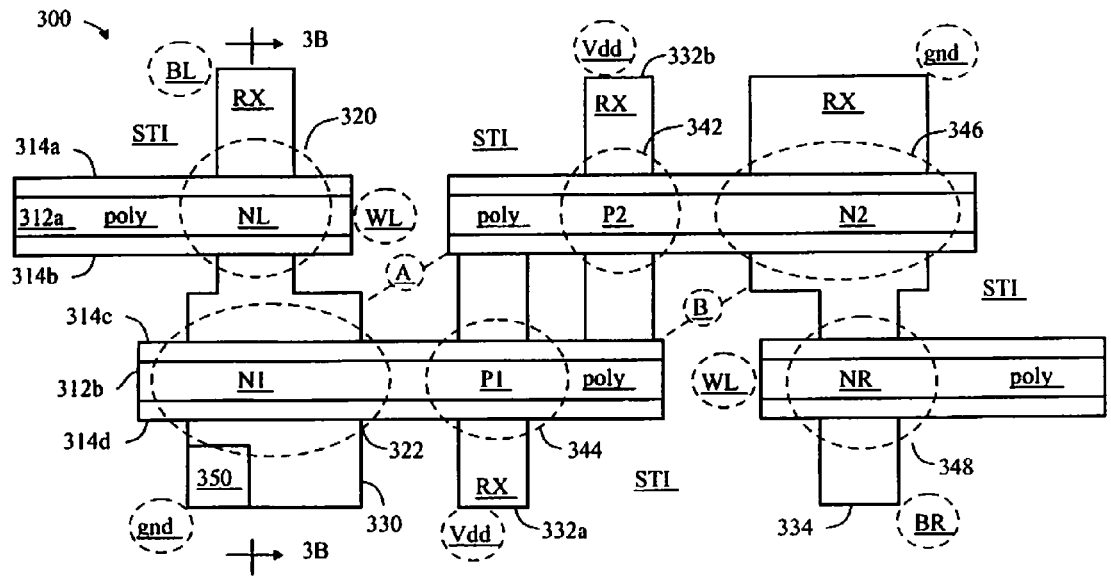
FIG. 3A is a top plan view of an SOI substrate having a 6T SRAM cell, according to the invention.
Figure 3B:
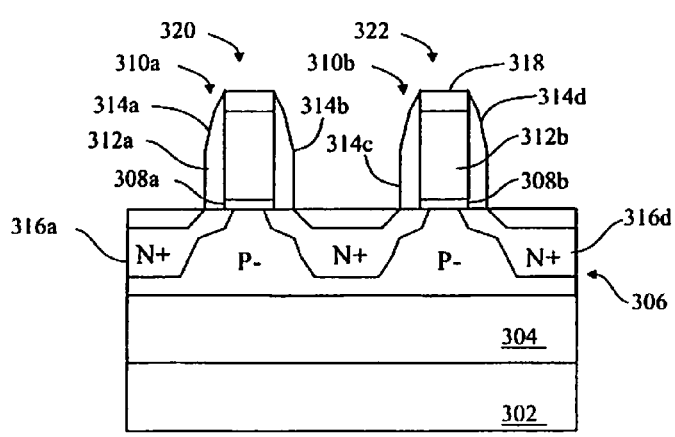
FIG. 3B is a cross-sectional view of the SOI substrate of FIG. 3A.

FIGS. 3A and 3B illustrate a SOI substrate 300 with FET devices which are "linked body" devices, formed in SOI, and suitable (for example) for SRAM.

the nFET transistors (PD and PG) may be formed using non-butted S/D through low thermal budget process (1, insitu-doped S/D; 2, shallow junction implant based S/D; or other similar process) to make the body link;

the pFET transistors (PUs) in neighboring cells may be formed using the same approach;

Contact n− body to ground and p− body to Vdd locally using silicide.

FIGS. 3A and 3B are similar to FIGS. 2A and 2B hereinabove, and show two transistors 320 and 322 (compare 220 and 222) formed in an SOI substrate 300 (compare 200).

FIG. 3A is nearly identical to FIG. 2A, but shows an additional contact 350. All other elements are similarly numbered (in 3A, 2A plus 100). FIG. 3B is very similar to FIG. 2B, but shows that the floating bodies of the two transistors are linked. The elements are similarly numbered (in 3B, 2B plus 100). It should be understood that the example of an SRAM cell, such as shown in FIGS. 2A/B and 3A/B are merely illustrative of an application for the method of forming a contact to a floating body which may be linked to a floating body of a second transistor, such as the two NFETs (NL and N1) which are illustrated.

As best viewed in FIG. 3B, the SOI substrate 300 may comprise a support substrate 302 having a thickness of a few hundred microns, an insulator (typically oxide) layer 304 having a thickness of approximately 10 μm, and a thin silicon layer 306 having a thickness of approximately 1000 nm (1 μm).

Two transistors 320 and 322 may be formed on the substrate 300, as follows. A thin layer of oxide having a thickness of approximately a few microns is disposed on the surface of the silicon layer 306, and is patterned to become gate dielectrics 308a and 308b (collectively referred to as "308") for the two transistors 320 and 322. Polysilicon structures 312a and 312b (collectively referred to as "312") are disposed on the gate dielectrics 308. The polysilicon conductors 312 may have a width of approximately 60 nm, and a thickness of approximately 80 nm. The polysilicon conductors 312 may be spaced approximately 200 nm apart from one another.

Two gate stacks 310a and 310b (collectively referred to as "310") are thus disposed on the silicon layer 306. Each gate stack 310a and 310b comprises a gate oxide 308a and 308b, a polysilicon conductor 312a and 312b, respectively.

Sidewall spacers 314a and 314b may be formed on the gate stack 310a, and sidewall spacers 314c and 314d may be formed on the gate stack 310b.

Source and drain diffusions 316a and 316b may be formed on the left (as viewed) and right (as viewed) sides of the gate stack 310a, in the silicon layer 306, and source and drain diffusions 316c and 316d may be formed on the left (as viewed) and right (as viewed) sides of the gate stack 310b, in the silicon layer 306. The diffusions 316a, 316b, 316c and 316d may collectively be referred to as "316".

The FET 320 comprises the gate stack 310a and diffusions 316a and 316b.

The FET 322 comprises the gate stack 310b, and diffusions 316c and 316d.

Silicide 318 may be disposed on the diffusions 316 and on the polysilicon conductors 312.

The S/D diffusions 316b and 316c may be formed as one continuous diffusion. The diffusion 316a may be formed as one continuous diffusion with a diffusion of another transistor (not shown) to the left of the transistor 320, and the diffusion 316d may be formed as one continuous diffusion with a diffusion of another transistor (not shown) to the right of the transistor 322.

An upper portion of the silicon layer between the source and drain diffusions may be referred to as the "channel", and a lower portion of the silicon layer between the source and drain diffusions may be referred to as the "body". The silicon layer may be doped to have P− polarity, and the source/drain (S/D) diffusions may be doped to have n+ polarity.

As best viewed in FIG. 3A, active areas 330, 332a, 332b and 334 may be formed for six transistors 320, 322, 342, 344, 346, 348 transistors of a 6 transistor ("6T") SRAM cell. Active area may be referred to as "RX". The two transistors 320 and 322 on the left may be NFETs, and have been described in detail with respect to FIG. 3B. The two transistors 346 and 348 on the right may also be NFETs, formed similarly to the transistors 320 and 322. The two transistors 342 and 344 in the middle (as viewed) may be PFETs, formed similarly to but with opposite polarity from the NFETs 320, 322, 346, 348. (The pull down (PD) transistors are 322 and 346. The passgate (PG) transistors are 320 and 348. The pull up (PU) transistors are 342 and 344.)

In FIG. 3A, it may be noted that the gates ("poly") NFET 322 and PFET 344 are contiguous (connected, linked) with one another, and this corresponds to transistors N1 and P1 in FIG. 1B. It may also be noted that the gates ("poly") PFET 342 and NFET 346 are contiguous (connected) with one another, and this corresponds to transistors P2 and N2 in FIG. 1B.

The transistors 320 and 322 are generally similar to the transistors 220 and 222, except that their bodies (P−) are linked (connected, in physical contact with one another, contiguous with one another). Generally, these linked bodies may be implemented by ensuring that the N+ S/D implants do not penetrate to the bottom of the silicon layer 306 (in other words, do not extend all the way to the BOX layer 304). Some exemplary dimensions may be:

width of a poly structure 312a/b, approximately 15 nm
  width of a sidewall spacer 314a/b/c/d, approximately 5 nm
  spacing between gate stacks 310a/b, approximately 100 nm
  thickness of silicon layer 306, approximately 75 nm
  depth of N+ S/D implants, approximately 60 nm Since the N+ S/D implants do not reach the BOX, a portion of the P− body extends under the S/D implants. For example, the portion of the P− body extending under the S/D implants may have a thickness of approximately 15 nm (75-60 nm). A selected one of the implants of interest in the example that follows is the outer S/D diffusion 516d of the transistor 322, which is the N1 PD transistor of an SRAM. This diffusion 516 will be connected to ground and, as will be seen in the example that follows, the linked body of the two transistors 520 and 522 will also be connected to ground.

Another difference between the transistors 320/322 and the transistors 220/222 are that the (linked) bodies of the transistors 320 and 322 are connected by a contact 350 extending from the surface of the substrate, through the silicon layer 304 to the linked bodies of the transistors 320 and 322. This contact may, for example, be tied to ground (the ground node of a memory cell, compare "gnd" in FIG. 1B). However, the contact may be tied to Vdd, or any desired voltage.

Figure 4:
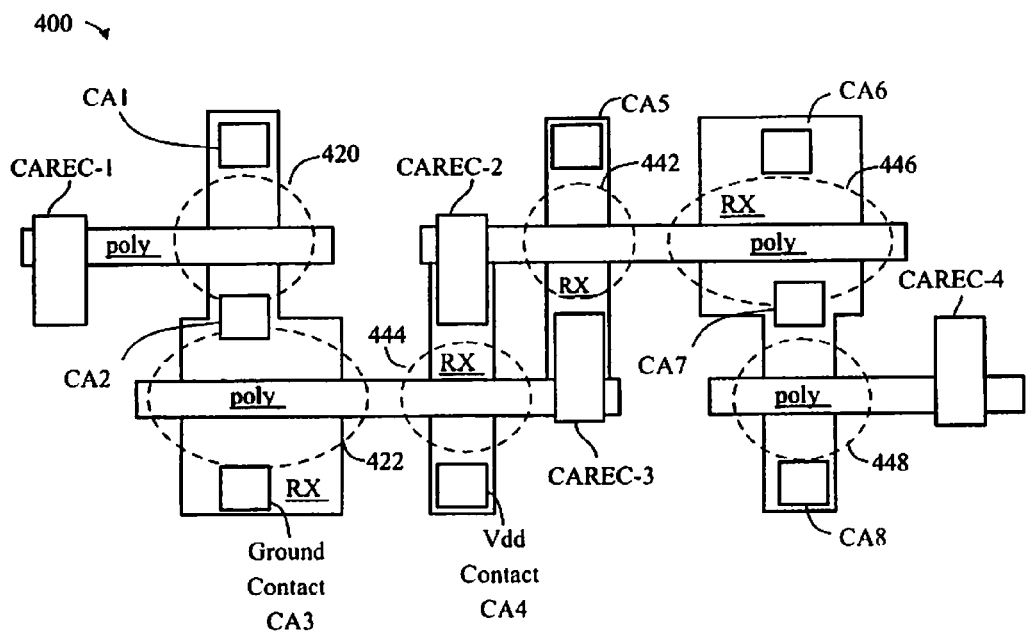
FIG. 4 is a top plan view of an SOI substrate having a 6T SRAM cell, according to the invention.

For simplicity, only one example of a contact 350 is shown in FIG. 3A. Note, for example, in FIG. 4, another contact (for Vdd) is shown extending to the RX corresponding to 332a of FIG. 3A.) (Other contacts are shown in FIG. 4, and are described below.)

The creation of the contact 350, and its resulting zigzag shape are described in greater detail hereinbelow. Generally, because of the zigzag shape, the area required to make the contact does not significantly increase the overall area needed to connect the two transistors 320 and 322.

Generally, in the past, extra area has been reserved (required) to make the body contact. Here, the contact is in a portion of the area already occupied by one of the S/D diffusions.

It should be noted that the linked body (P1) extends under the "outer" diffusion 316d of the NFET 322. The "inner" diffusion of the NFET 322 (N1, PD) is the one that is formed in common with the inner diffusion of the NFET 320 (NL). This is useful because, as described hereinbelow, a contact to the floating body (P−) will be made through that outer diffusion 316d.

It should be understood that the contact described here could have other than a zigzag shape. It should also be understood that the feature of tying a contact to the body of the FET is not limited to any specific circuitry. For example, a sensing amplifier can use the same structure to make the body contact together.

FIG. 4 is a top plan view illustrating an overall SRAM cell layout, according to the invention. Compare FIG. 3A (similar RX and poly is shown, as well as 6 transistors. numbers incremented by 100). Notice the addition of Ground Contact and Vdd Contact. Whereas in FIG. 3, only silicon and polysilicon (and sidewall spacers) were shown, FIG. 4 additionally shows the contact layers to show connecting to the various nodes. The small square contacts ("CA") are for ground and Vdd. The rectangular contacts (CAREC) are for cross-coupling. More specifically, the following contacts are shown in FIG. 4:

CAREC-1, contact for wordline (WL)
  CAREC-2, cross-couple contact
  CAREC-3, cross-couple contact
  CAREC-4, contact for wordline (WL)
  CA1, left bitline (BL)
  CA2, cross-couple contact for left node
  CA3, ground
  CA4, Vdd
  CA5, Vdd
  CA6, ground
  CA7, cross-couple contact for right node
  CA8, right bitline (BR)

An Exemplary Process

FIGS. 5A-11B illustrate an embodiment of and a process for making linked body FET devices for SOI SRAM, with body contacts, according to the invention. The process may be described in a series (sequence) of steps. Some well-known steps and/or characteristics of process steps may only be described briefly, and may be omitted entirely.

Figure 5A:
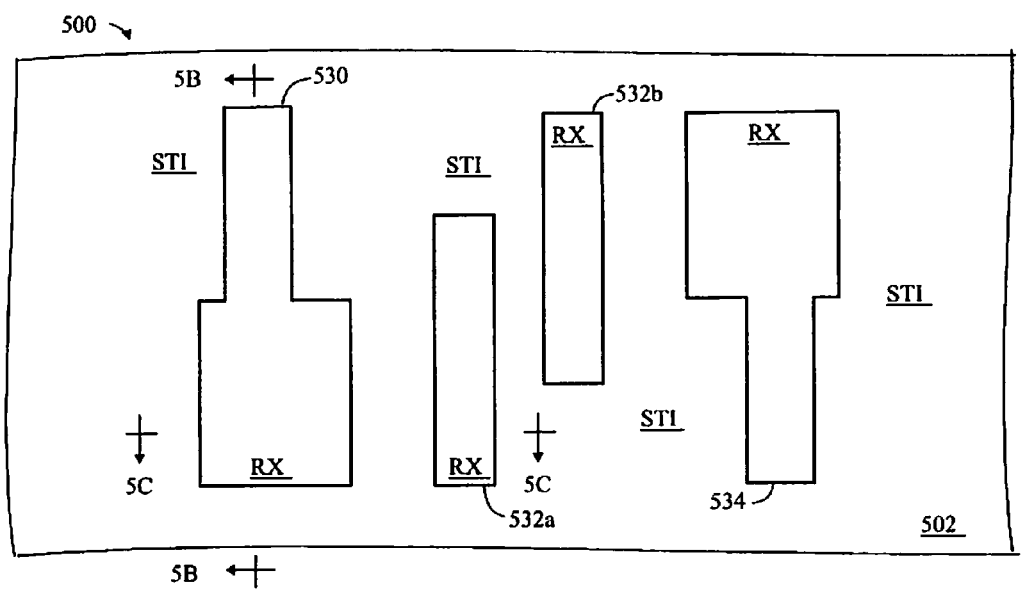
FIG. 5A is a top plan views of an SOI substrate having a 6T SRAM cell, according to the invention.
Figure 5B:
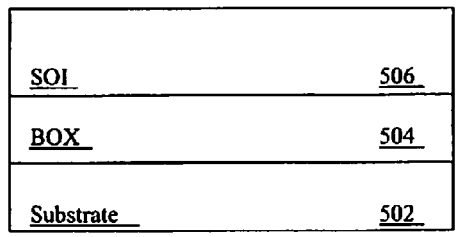
FIG. 5B is a cross-sectional view of the SOI substrate of FIG. 5A, according to the invention.
Figure 5C:
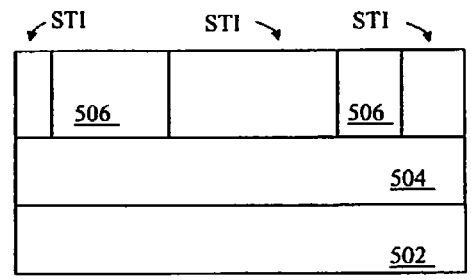
FIG. 5C is a cross-sectional view of the SOI substrate of FIG. 5A, according to the invention.

FIGS. 5A-5C illustrate a first of a sequence of steps of a process flow for forming two NFETs (520 and 522, not shown yet, compare 320 and 322) with linked bodies and a contact to the linked bodies. Compare FIGS. 3A and 3B. (Subsequent steps are illustrated in FIGS. 6A/B through 11A/B.)

An SOI substrate 500 (compare 300) comprises a layer of silicon 506 on a BOX layer 504, on a support substrate 502.

A number of active areas (RX) 530, 532a/b, 534 (compare 330, 332a/b, 334) are formed in the silicon layer 506, and are surrounded by shallow trench oxide (STI).

Figure 6A:
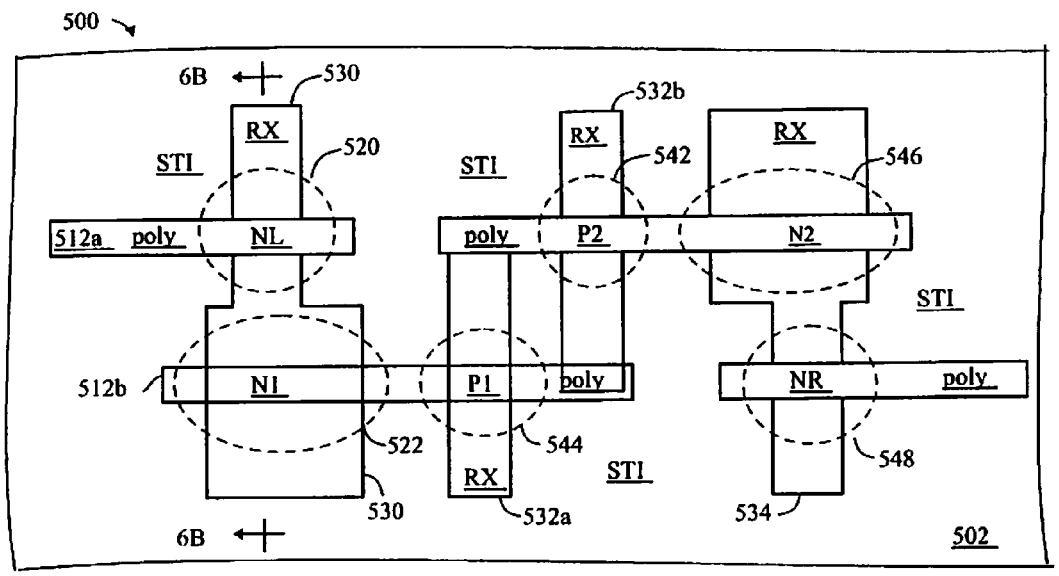
FIG. 6A is a top plan views of an SOI substrate having a 6T SRAM cell, according to the invention.
Figure 6B:
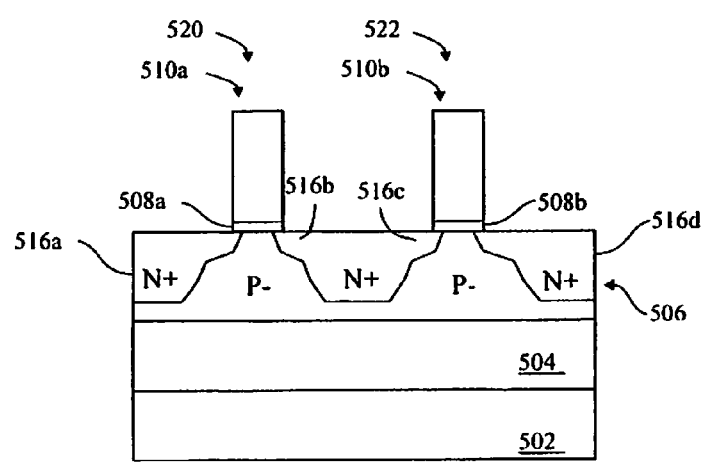
FIG. 6B is a cross-sectional view of the SOI substrate of FIG. 6A, according to the invention.

FIGS. 6A and 6B illustrate next steps of the process flow for forming the two NFETs (520 and 522).

Gate dielectric 508a and 508b (compare 308a and 308b) is formed, and poly lines 512a and 512b (compare 312a and 312b) are formed, in a conventional manner. The gate dielectrics and poly lines constitute gate stacks 510a and 510b (compare 310a and 310b) for transistors 520 and 522 (compare 320 and 322), respectively.

Diffusions 516a, 516b, 516c and 516d (compare 316a, 316b, 316c and 316d), such as N+ source/drain (S/D) diffusions are formed, in a conventional manner, without going all the way to the BOX 504, leaving two floating P− bodies which are linked (contiguous) with one another, as illustrated. Dimensions may be as discussed above with respect to FIG. 3B.

Generally, in order to ensure that the two P− bodies are linked, the N+ diffusions may be controlled to extend only 50-80% of the distance through the silicon layer 506. For "complementary" PFETs, the bodies would be N+ and the diffusions would be P−.

The two NFETs 520 and 522 (compare 220 and 222; also 320 and 322; also 420 and 422) are labeled in FIG. 6A. The two PFETs 542 and 544 (compare 242 and 244; also 342 and 344; also 442 and 444) are also labeled. The two NFETs 546 and 548 (compare 246 and 248; also 346 and 348; also 446 and 448) are also labeled.

Figure 7A:
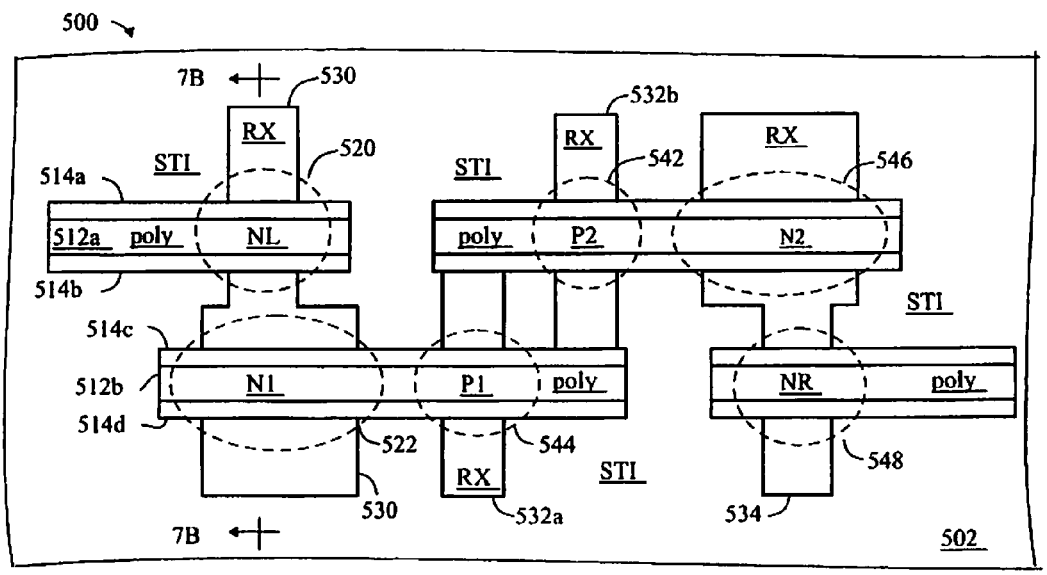
FIG. 7A is a top plan views of an SOI substrate having a 6T SRAM cell, according to the invention.
Figure 7B:
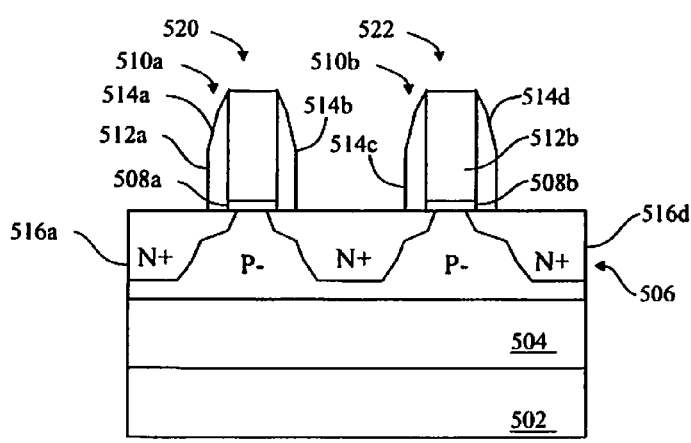
FIG. 7B is a cross-sectional view of the SOI substrate of FIG. 7A, according to the invention.

FIGS. 7A and 7B illustrate next steps of the process flow for forming the two NFETs (520 and 522).

Figure 8A:
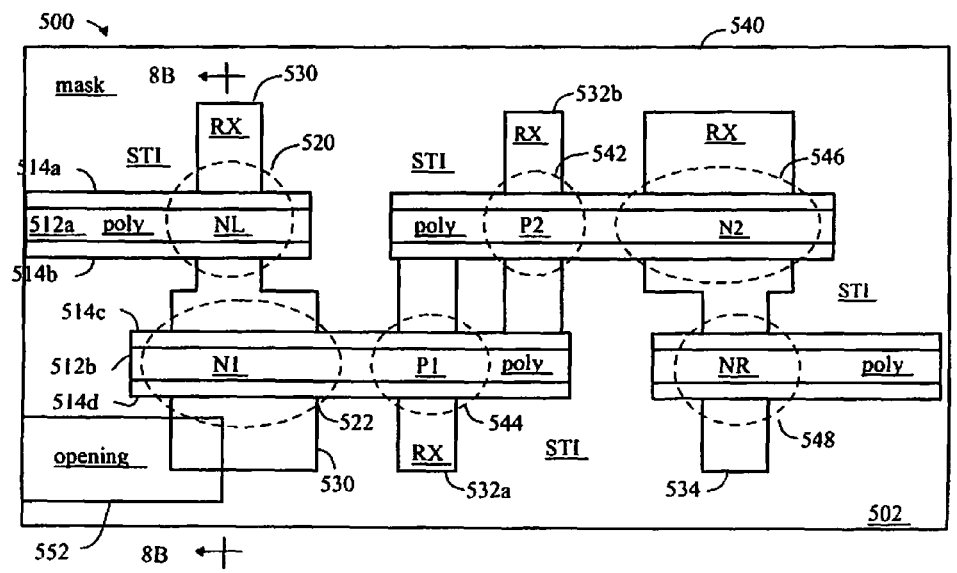
FIG. 8A is a top plan views of an SOI substrate having a 6T SRAM cell, according to the invention.
Figure 8B:
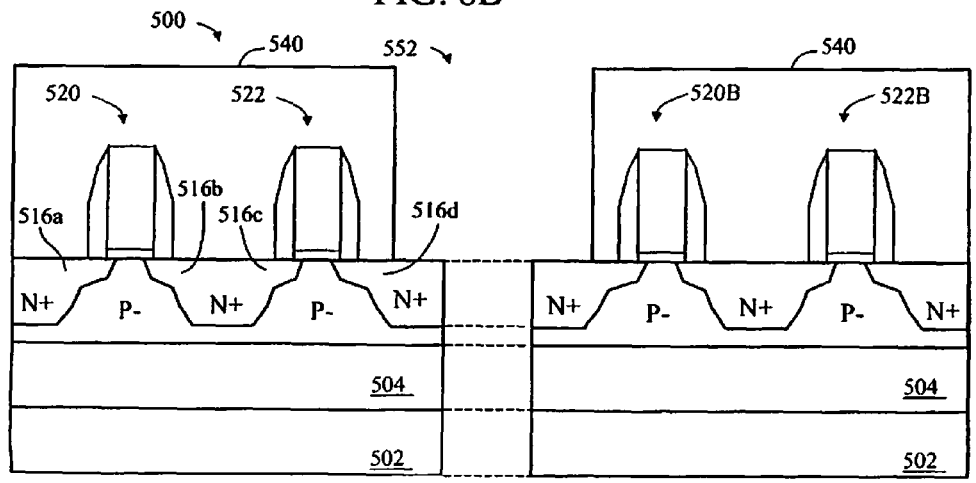
FIG. 8B is a cross-sectional view of the SOI substrate of FIG. 8A, according to the invention.

Spacers 514a and 514b are formed on the poly line 512a, and spacers 514c and 514d are formed on the poly line 512b. (Similar spacers may be formed on the other poly lines shown in FIG. 7A.) The spacers may have a thickness of approximately 15 nm. FIGS. 8A and 8B illustrate next steps of the process flow for forming the two NFETs (520 and 522).

A mask 540 is formed over the substrate 502, covering the gates and sidewalls of the transistors 520 and 522, covering the common S/D diffusions 516b/516c of the two transistors, covering the outer diffusion 516a of the left (as viewed) transistor 520, and leaving an opening 552 where a contact (550, shown below, compare 350) to the P− linked bodies of the transistors 520 and 522 will be made, through the outer S/D diffusion 516d of the right (as viewed) transistors 522. The mask 540 may be photoresist, or a hard mask.

Generally, the opening 552 is located above at least one of the outer diffusions 516a or 516d of the two transistors 520 and 522. (Recall that the inner diffusions 516b and 516c, between the two transistors 520 and 522, are contiguous with one another.) In this example, the opening 552 is shown located at above the outer diffusion 516d of the transistor 522. As illustrated in FIG. 8B, the opening is on the right hand side (as viewed) of the transistor 522. And, as illustrated in FIG. 8A, the opening is on the bottom side (as viewed) of the transistor 522.

As best viewed in FIG. 8B, the opening 552 is spaced a distance, such as approximately 20-25 nm, away from the outer sidewall spacer 514d of the transistor 522. Since ultimately the silicon (with diffusion) underneath the opening will be etched away, to make contact with the linked body (P−) of the transistors 520 and 522, this ensures that a sufficient amount of diffusion 516d will remain for proper functioning of the transistor 522. Also, this ensures that the channel for the transistor 522 will not be damaged.

As best viewed in FIG. 8A, the opening 552 does not extend all the way across the active area (RX) forming the diffusion 516d. For example, assuming that the RX extends approximately 120 nm in the direction of the poly line 512b, the opening 552 extends only approximately 50 nm in that direction, or 25-50% as much as the RX, leaving approximately 30-60 nm of the RX (and diffusion) unaffected.

In FIG. 8B, another pair of transistors 520B and 522B are illustrated to the right hand side (as viewed) of the transistor pair 520/522. (The dashed lines indicate that this is an "exploded" view.) The transistors 520B/522B may be corresponding two transistors (NFETs) of an adjacent 6T SRAM cell (not shown). Although not shown in FIG. 8A, this adjacent 6T SRAM cell would be immediately below the 6T SRAM cell which is shown.

In FIG. 8A, the opening 552 can be seen extending from the right side diffusion 516d of the transistor 522 to the left side diffusion (not numbered) of the transistor 520B. The contact (not shown yet) will make contact with the linked body (P−) of the transistors 520B and 522B.

Figure 9A:
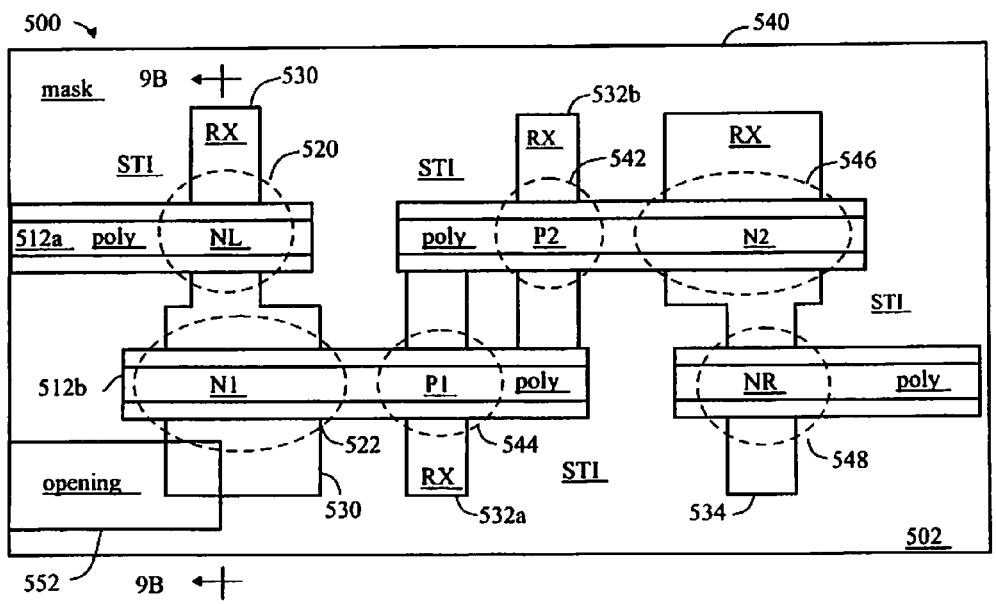
FIG. 9A is a top plan views of an SOI substrate having a 6T SRAM cell, according to the invention.
Figure 9B:
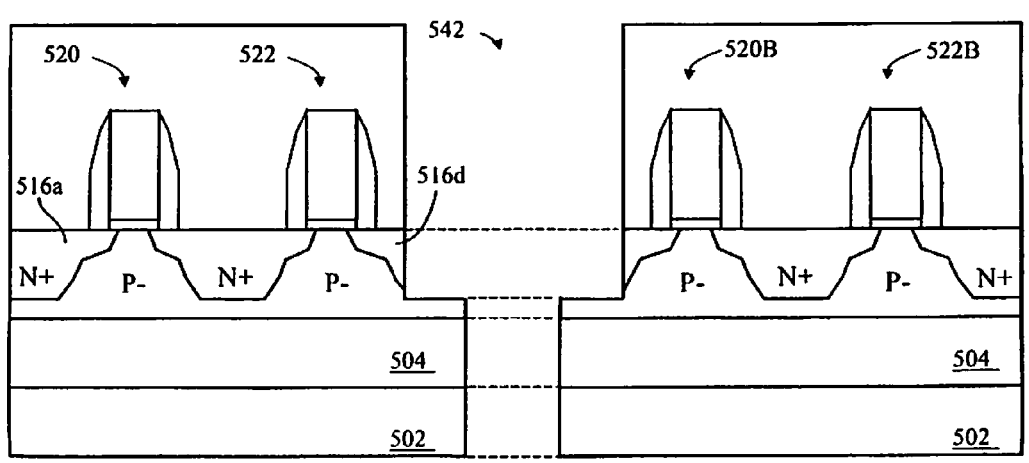
FIG. 9B is a cross-sectional view of the SOI substrate of FIG. 9A, according to the invention.

FIGS. 9A and 9B illustrate next steps of the process flow for forming the two NFETs (520 and 522).

The silicon 502 is etched, under the opening 552, using regular RIE (reactive ion etching). This creates an opening 554 in the silicon 502 extending nearly, preferably not all the way to the BOX 504. The opening exposes portions of the P− linked body of the transistors 520/522 (as well as 520B/52B), and a contact will be made thereto (in subsequent steps).

The opening 554 extends into the diffusion area 516d, exposing a side surface thereof. When the mask is removed (in the next step), the top surface of the diffusion area 516d will be exposed, as it previously was (before the mask).

Note in FIG. 9B that the opening 554 does not extend all the way to the BOX 504. This is important because contact will be made to the portion of the linked body (P−) which extends under the diffusion 516d.

Figure 10A:
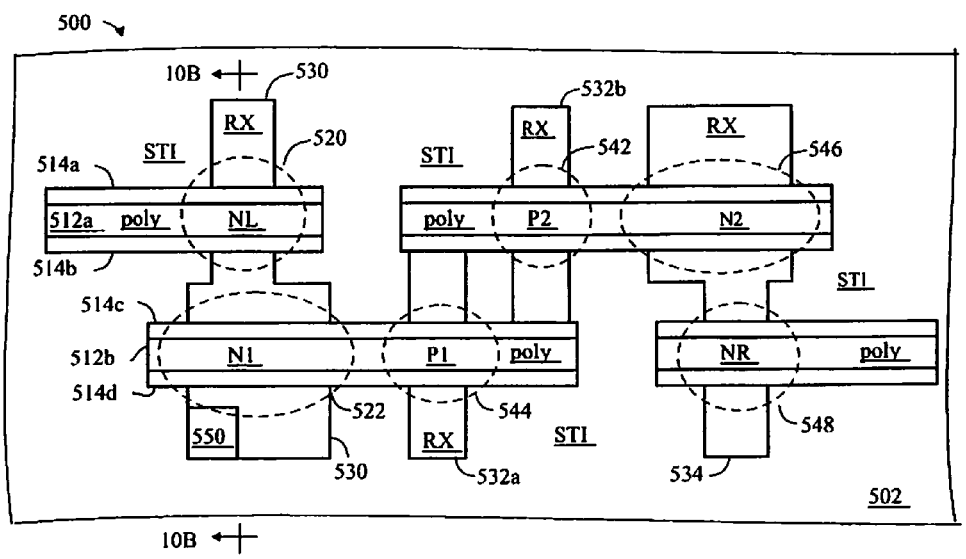
FIG. 10A is a top plan views of an SOI substrate having a 6T SRAM cell, according to the invention.
Figure 10B:
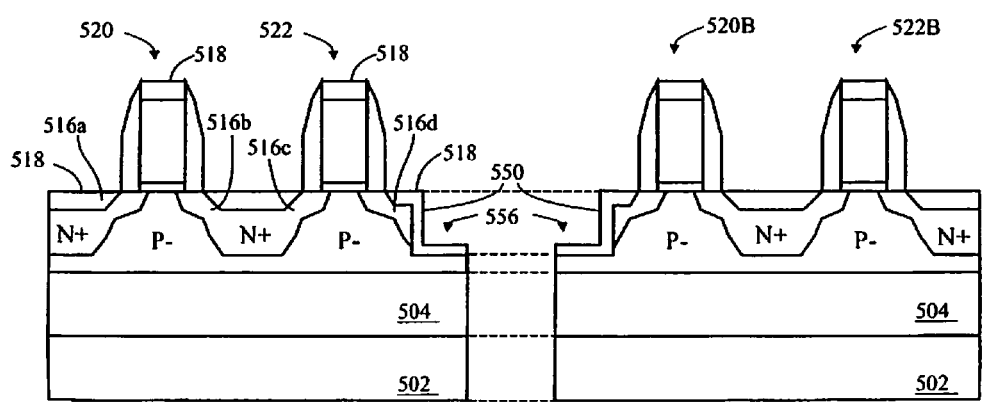
FIG. 10B is a cross-sectional view of the SOI substrate of FIG. 10A, according to the invention.

FIGS. 10A and 10B illustrate next steps of the process flow for forming the two NFETs (520 and 522).

The mask 540 is removed, and exposed surfaces of silicon are silicided to have silicide 518:
  on top of the poly gate structures 512a and 512b,
  on top of the S/D diffusion 516a, and
  on the exposed top and side surfaces of the opening 554 in the S/D diffusion 516d.

Silicide is also formed on corresponding silicon surfaces for the transistors 520B and 522B.

The silicide 518 forms a contact 550 with the linked body portions of the transistors 520 and 522 (as well as 520B and 522B), which can be connected with (tied to) a desired potential, such as ground.

As mentioned above, it should be noted that the linked body (P1) extends under the "outer" S/D diffusion 316d of the NFET 322. This is useful because contact (550) to the floating body (P−) is primarily being made in the vertical direction, through that outer diffusion 316d.

Notice that the contact 550 is zigzag shaped. A "zigzag" may be a line or course that proceeds by sharp turns in alternating directions. Here, the contact is "Z"-shaped, having a top portion extending horizontally (as viewed) to the left (as viewed), a bottom portion extending horizontally (as viewed) to the right (as viewed), and a middle portion extending vertically (as viewed) from the right end of the top portion to the left end of the bottom portion. A remaining opening 556 (remaining after the silicon in the opening 554 is silicided) may be filled with oxide from a subsequent step of forming inter-level dielectric (ILD).

The zigzag shape is essentially an "artifact" of siliciding, where the top exposed portion of the outer S/D diffusion will be contacted (conventional), the exposed sidewall of the opening 554 becomes silicided, and the bottom (horizontal) surface of the opening 554 also become silicided.

Figure 10C:
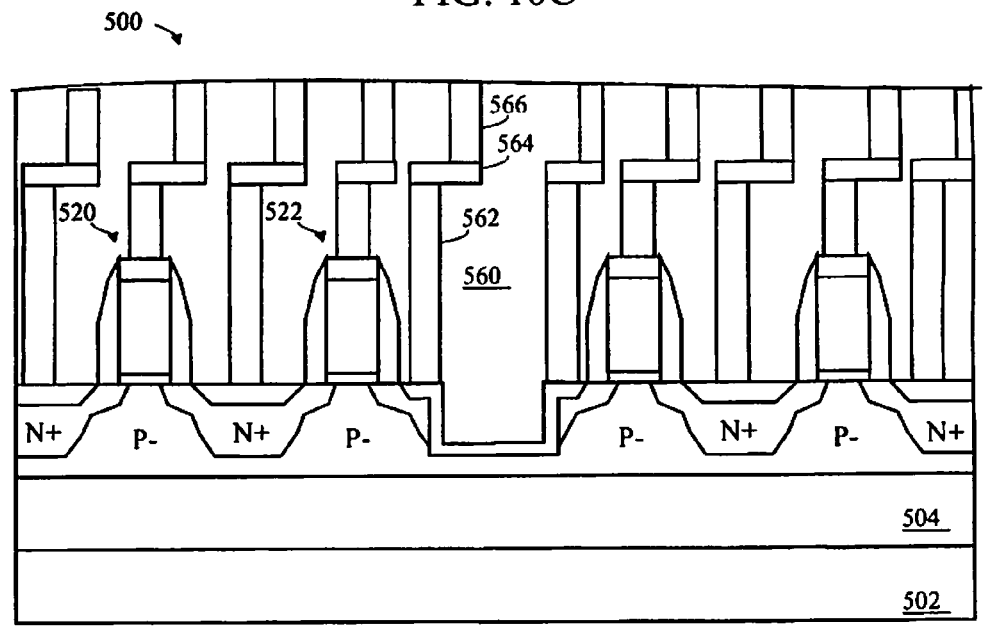
FIG. 10C is a cross-sectional view, similar to FIG. 10B, according to the invention.

FIG. 10C illustrates the subsequent step of forming inter-level dielectric (ILD) 560. Metal-filled vias 562 are disposed in a lower portion of the ILD 560, and connect with the various silicided elements (source, drain, gate of the transistors). A metal interconnect layer 564 is disposed in a middle portion (as shown) of the ILD 560. And, metal-filled contacts 566 extend from the interconnect layer 564 to a top surface (as shown) of the ILD 560. It will be appreciated that this illustration of ILD is greatly simplified.

Figure 11:
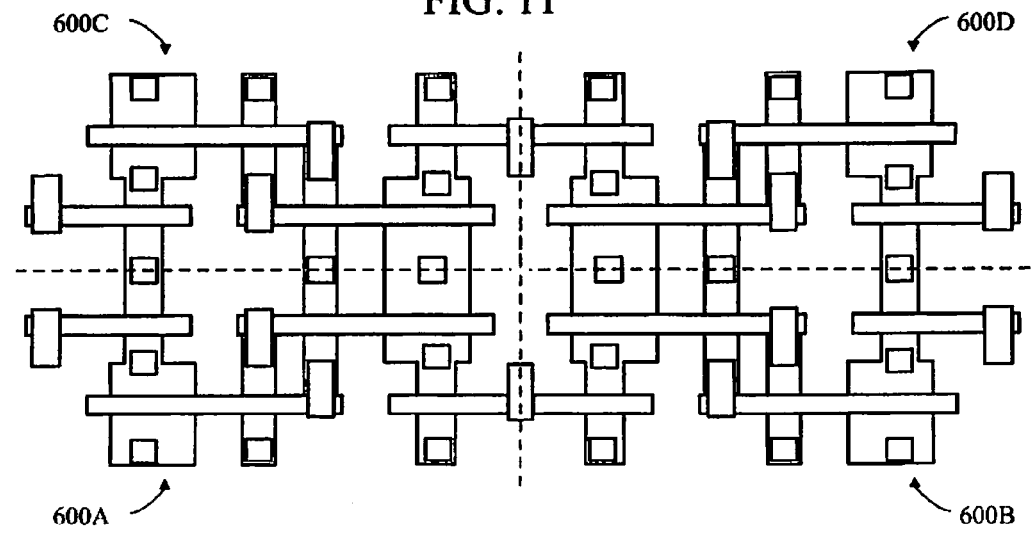
FIG. 11 is a top plan view of an array of SRAM cells, with contacts, according to the invention.

FIG. 11 shows a number of SRAM cells 600A, 600B, 600C, 600D (compare FIG. 3A, 300 and FIG. 4, 400), arranged in a 2×2 array. Compare FIG. 4, which shows these contacts (grounded node, Vdd node).

Alternate Embodiments

An NFET body connected to ground (gnd) has been described above. A person having ordinary skill in the art to which this invention most nearly pertains will readily understand that the techniques disclosed herein could be used to connect a PFET body to Vdd (source voltage).

Applying to embedded SiGe and embedded SiC source/drain strain enhancement with readily available recessed silicon. SiGe and SiC are engineering techniques used to enhance the channel mobility and so that device conductivity. Given they are new techniques to the CMOS semiconductor technology, all new process elements should be additive to each other.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. Method of making contact with a body of an FET comprising:
    etching an opening through a S/D diffusion of the FET, thereby exposing a portion of the body which is extending under the diffusion;
    siliciding to form a contact with the body; and
    connecting the contact to ground.

2. The method of claim 1, including:
    spacing the opening approximately 20-25 nm away from a gate stack of the FET.

3. The method of claim 1 wherein:
    the portion of the body extending under the diffusion has a thickness of approximately 15 nm.

4. Method of making contact with a body of an FET comprising:
    etching an opening through a S/D diffusion of the FET, thereby exposing a portion of the body which is extending under the diffusion;
    siliciding to form a contact with the body; and wherein
    the FET is a pull down NFET of an SRAM cell.

5. Method of forming FETs with floating bodies on SOI substrates, and making contact to selected ones of the floating bodies, comprising:
    forming S/D diffusions extending only partway through a silicon layer atop a buried oxide (BOX) layer, resulting in a portion of the body of the transistor extending under the S/D diffusions;
    etching an opening through at least one of the S/D diffusions of at least one of the FETs, thereby exposing a portion of the floating body which is extending under the diffusion area; and
    making contact with the body through the opening.

6. The method of claim 5, wherein:
    the opening is spaced approximately 20-25 nm away from a gate stack of the FET.

7. The method of claim 5, wherein:
    the silicon layer has a thickness of approximately 75 nm; and
    the S/D diffusions extend approximately 60 nm into the silicon layer.

8. The method of claim 5, wherein:
    the portion of the body extending under the S/D diffusions has a thickness of approximately 15 nm.

9. The method of claim 5, wherein:
    the contact is made by siliciding.

10. The method of claim 5, wherein:
    the FET through which contact with the body is made is a pull down (PD) FET of an SRAM.

11. The method of claim 10, wherein:
    the contact is connected to ground.

* * * * *